(12) United States Patent
Chen et al.

(10) Patent No.: US 9,369,808 B2
(45) Date of Patent: *Jun. 14, 2016

(54) ACOUSTIC TRANSDUCER WITH HIGH SENSITIVITY

(71) Applicant: MERRY ELECTRONICS (SHENZHEN) CO., LTD., Shenzhen (CN)

(72) Inventors: Jen-Yi Chen, Taichung (TW); Chao-Sen Chang, Taichung (TW); Chun-Chieh Wang, Taichung (TW); Yong-Shiang Chang, Taichung (TW)

(73) Assignee: MERRY ELECTRONICS (SHENZHEN) CO., LTD. (CN)

( * ) Notice: Subject to any disclaimer, the term of this patent is extended or adjusted under 35 U.S.C. 154(b) by 2 days.

This patent is subject to a terminal disclaimer.

(21) Appl. No.: 14/056,232

(22) Filed: Oct. 17, 2013

(65) Prior Publication Data

US 2015/0110302 A1  Apr. 23, 2015

(51) Int. Cl.
*H04R 25/00* (2006.01)
*H04R 19/00* (2006.01)
*B81C 1/00* (2006.01)
*H04R 19/04* (2006.01)
*H04R 31/00* (2006.01)

(52) U.S. Cl.
CPC .......... *H04R 19/005* (2013.01); *B81C 1/00182* (2013.01); *B81B 2201/0257* (2013.01); *B81B 2203/0127* (2013.01); *H04R 19/04* (2013.01); *H04R 31/003* (2013.01); *H04R 31/006* (2013.01); *H04R 2201/003* (2013.01); *H04R 2499/11* (2013.01)

(58) Field of Classification Search
CPC ........ H04R 1/08; H04R 19/005; H04R 19/04; H04R 23/006; H04R 31/003; H04R 2201/003; H04R 7/18; H04R 7/20; H04R 31/006; H04R 2499/11; B81B 3/0021; B81B 2201/0257
USPC ......... 381/113, 116, 355, 369, 174, 175, 191; 361/140, 170, 181; 29/594, 609.1; 257/416, 419; 367/140, 170, 181, 189
See application file for complete search history.

(56) References Cited

U.S. PATENT DOCUMENTS

| | | | |
|---|---|---|---|
| 6,535,460 B2 * | 3/2003 | Loeppert et al. | 367/181 |
| 8,081,783 B2 * | 12/2011 | Chien et al. | 381/174 |
| 2008/0137884 A1 * | 6/2008 | Kim et al. | 381/174 |
| 2012/0027235 A1 * | 2/2012 | Chan et al. | 381/174 |
| 2015/0109889 A1 * | 4/2015 | Chen et al. | 367/189 |

* cited by examiner

*Primary Examiner* — Huyen D Le
(74) *Attorney, Agent, or Firm* — Bacon & Thomas, PLLC

(57) ABSTRACT

An acoustic transducer with high sensitivity includes a base plate, a back plate and a vibrating membrane. The vibrating membrane is peripherally fixed to the base plate and covers an opening of the base plate. The back plate has a positioning member connected between the back plate and the vibrating membrane, so as to define at least one vibratile portion that is arranged annularly by a plurality of elastic members. Thereby, the vibratile portion has a reduced deformable width and increased rigidity, so can effectively improve its acoustically receiving sensitivity and signal-to-noise ratio.

14 Claims, 3 Drawing Sheets

ACOUSTIC TRANSDUCER WITH HIGH SENSITIVITY

BACKGROUND OF THE INVENTION

1. Technical Field

The present invention relates to acoustic transducers, and more particularly to an acoustic transducer whose vibrating membrane is centrally provided with a positioning member so as to define a vibratile portion that can vibrate freely, wherein the vibratile portion is peripherally provided with a plurality of elastic members that allow the vibratile portion to perform piston-like vertical vibration, thereby enhancing the sensitivity of the acoustic transducer.

2. Description of Related Art

MEMS microphones are known to have advantages of being compact and easy to manufacture, so are extensively used in mobile phones. A conventional acoustic transducer 80, as shown in FIG. 1, has a base plate 81, a back plate 82 and a vibrating membrane 83. The vibrating membrane 83 covers an opening 811 of the base plate 81, and the back plate 82 is deposited on the base plate 81 and separated from the vibrating membrane 83 by a gap 84. An electrode unit 85 is arranged on the back plate 82 and there is a fixing portion 821 that fixes an outer periphery of the vibrating membrane 83. Thereby, when the acoustic transducer 80 receives an acoustic wave, the vibrating membrane 83 vibrates and changes its distance from the electrode unit 85, causing change of capacitance.

When the acoustic transducer 80 receives acoustic waves and the vibrating membrane 83 deforms in the direction along which the acoustic waves advance, since the vibrating membrane 83 only has its periphery fixed to the base plate 81, the vibrating membrane 83 has its central part deforming more than its peripheral part, so the vibrating membrane 83 now forms an arc with its opening facing downward. This uneven deformation can cause the effective sensing area A of the vibrating membrane 83 significantly smaller than the working area of the vibrating membrane 83, leading to negative impact on the acoustic transducer 80 in terms of sensitivity and signal-to-noise ratio. Existing approaches to preventing the vibrating membrane from the arched deformation include increasing the thickness of the vibrating membrane and reducing the total area of the vibrating membrane in order to increase the vibrating membrane's rigidity. However, these existing approaches can be subject to increase manufacturing process complexity and manufacturing cost. Hence, there is a need for a feasible technical scheme for solving this problem.

BRIEF SUMMARY OF THE INVENTION

In view of this, the primary objective of the present invention is to provide an acoustic transducer with high sensitivity, wherein the acoustic transducer can have the deformable width of its vibrating membrane controlled so that the vibrating membrane can perform a nearly parallel movement, thereby effectively improving its acoustically receiving sensitivity and signal-to-noise ratio.

For achieving the above objective, the present invention provides an acoustic transducer with high sensitivity, which comprises a base plate, a back plate and a vibrating membrane. The vibrating membrane has its periphery fixed to the base plate and covers an opening of the base plate. The back plate has a positioning member that is connected to the vibrating membrane, and at least one vibratile portion is defined on the vibrating membrane. There are a plurality of elastic member arranged peripherally around the vibratile portion.

Thereby, in the present invention, the deformable width of the vibratile portion is smaller than the working width of the vibrating membrane. The smaller deformable width can increase the rigidity of the vibratile portion without changing the vibrating membrane's thickness or dimensions. When the acoustic transducer receives acoustic waves, the elastic members deform prior to the vibratile portion, in order to enable the vibratile portion perform vertical vibration in the form of a nearly parallel movement, which effectively improve the acoustically receiving sensitivity and signal-to-noise ratio. The present invention is also helpful to the control of process stability and manufacturing costs.

Preferably, the positioning member is a solid column or a hollow column or is formed by a plurality of solid posts to define a single vibratile portion or two or more vibratile portions.

Preferably, the vibrating membrane is circular and the positioning member is connected to a center of the vibrating membrane, so that the vibratile portion is ring-shaped. Alternatively, when the vibrating membrane is rectangular, the positioning member is linearly presented to define two rectangular vibratile portions that both perform even deformation and movement.

DETAILED DESCRIPTION OF THE INVENTION

Figure 1:
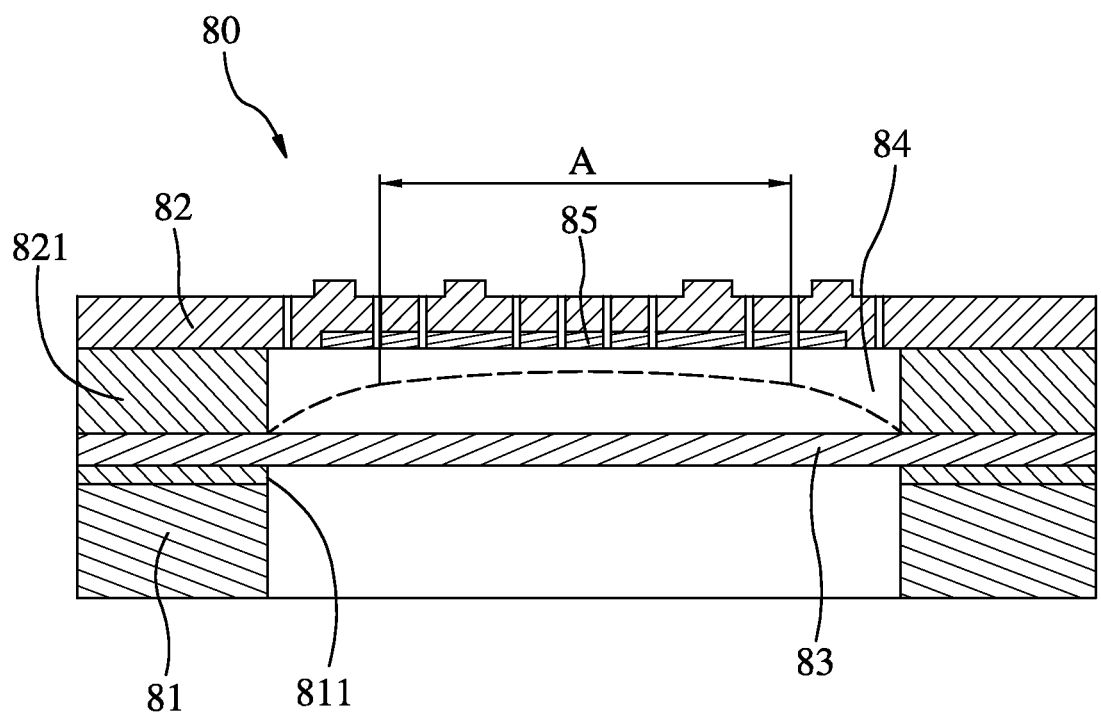
FIG. 1 is a cross-sectional view of a conventional acoustic transducer.
Figure 2:
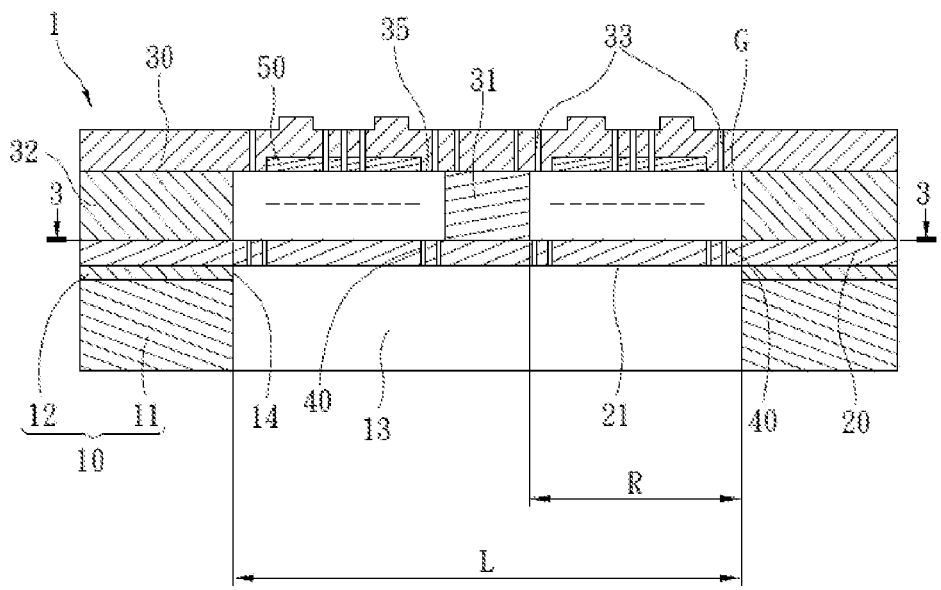
FIG. 2 is a transverse cross-sectional view of an acoustic transducer according to a first embodiment of the present invention.
Figure 3:
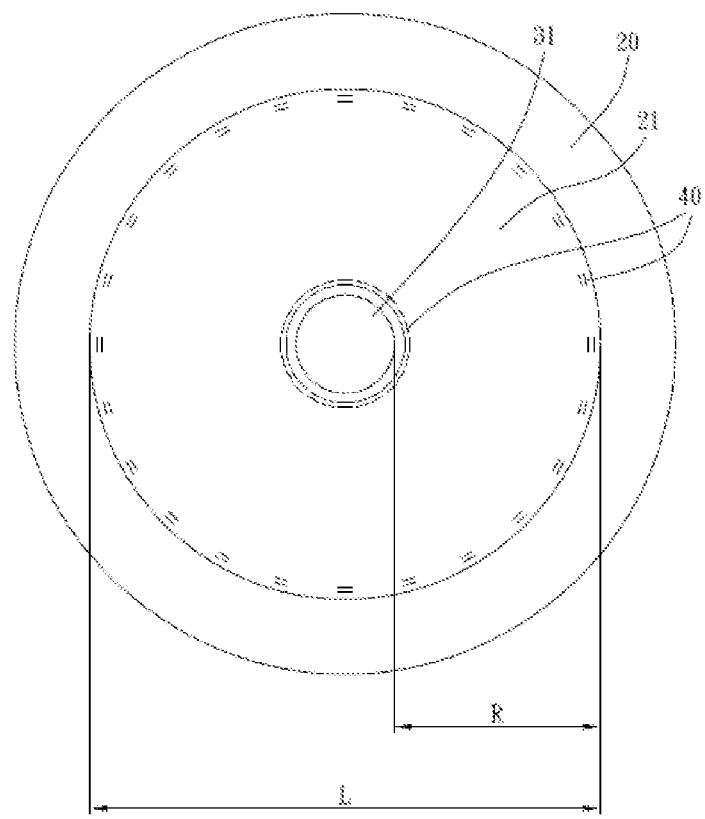
FIG. 3 is a vertical cross-sectional view of the acoustic transducer of FIG. 2 taken along Line 3-3.

For further illustrating the features of the present invention, the following description, in conjunction with the accompanying drawings and preferred embodiments, is set forth as below. Referring to FIG. 2 and FIG. 3, according to a first embodiment of the present invention, an acoustic transducer 1 mainly comprises a base plate 10, a vibrating membrane 20, a back plate 30 and a plurality of elastic members 40. The structure and configuration of the components are described in the following sections.

As shown in FIG. 2, the base plate 10 is formed by a silicon bottom layer 11 and an insulation layer 12 deposited on the silicon bottom layer 11. The base plate 10 has a passage 13 formed through the base plate 10 for acoustic waves passing therethrough. Besides, the passage 13 having an opening 14 at the insulation layer 12.

The vibrating membrane 20 is peripherally fixed to the base plate 10 and covers the opening 14. In the present embodiment, the vibrating membrane 20 is circular. Of course, people skilled in the art may make the vibrating membrane be square or in other geometric shapes and correspondingly modify the appearance of the opening 14.

Referring to FIG. 2, the back plate 30 is covering over the insulation layer 12 and the vibrating membrane 20. The back plate 30 has a connecting member 32 peripherally extended thereof, so as to connect the vibrating membrane 20, and a surface 35 facing the vibrating membrane 20 and accordingly separated from the vibrating membrane 20 by a gap G. In addition, the back plate 30 has a positioning member 31 extending from the surface 35 toward the vibrating membrane 20, for prohibiting a central part of the vibrating membrane 20 from vibrating. The back plate 30 further has a plurality of sound holes 33 for allowing acoustic waves to pass therethrough. The number of the sound holes 33 may vary according to practical needs. For meeting various means of packaging, the acoustic transducer 1 may have acoustic waves transmitted from the sound holes 33 to the vibrating membrane 20. Referring to FIG. 2 and FIG. 3, the positioning member 31 serves to constrain the central part of the vibrating membrane 20 from vibrating, by connecting with the central part of the vibrating membrane 20, in order to define a vibratile portion 21 on the vibrating membrane 20, which acts to vibrate freely in comparison with the center part of the vibrating membrane 20. In the present embodiment, the vibratile portion 21 is ring-shaped and locates between the periphery of the positioning member 31 and the periphery of the vibrating membrane 20 that is connected to the base plate 10. In the present embodiment, the positioning member 31 is a solid column. People skilled in the art may make the positioning member 31 be a solid or hollow column of other geometric shapes, so as to change the geometric shape and number of the vibratile portion 21.

The elastic members 40 are arranged along an inner periphery and an outer periphery of the vibratile portion 21 in which the inner and outer peripheries are relatively adjacent to and far from the positioning member 31, respectively. The number of the elastic members 40 may vary according to practical needs.

When an acoustic wave reaches the vibrating membrane 20 via the passage 13 or via the sound holes 33, referring to FIG. 2 and FIG. 3, the elastic members 40 are innately more elastic than the vibratile portion 21 per se is, so as to enable the elastic members 40 perform deformation prior to the vibratile portion 21 deforms. Plus, a deformable width R of the vibratile portion 21 is smaller than the working width L of the vibrating membrane 20. So the rigidity of the vibratile portion 21 is increased by means of the smaller deformable width R, which restrains its deformation correspondingly. As a result, in response to the acoustic wave, the vibratile portion 21 accompanied with the elastic members 40 can perform a nearly parallel movement. Although, some working area of the vibrating membrane 20 is sacrificed, compared to the case without the positioning member 31, the valid sensing area increases instead. This allows the acoustic transducer 1 to have improved acoustically receiving sensitivity and signal-to-noise ratio under the condition that the thickness and material of the vibrating membrane 20 are not changed.

Figure 4:
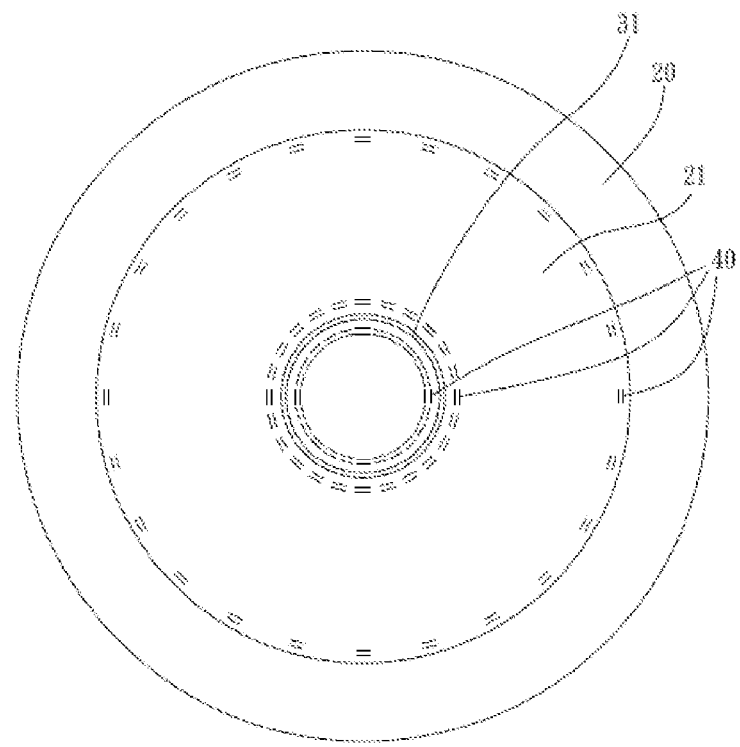
FIG. 4 is a vertical cross-sectional view of an acoustic transducer according to a second embodiment of the present invention.

Referring to FIG. 4, in a second embodiment of the present invention, an acoustic transducer is structurally similar to the first embodiment except that the positioning member 31 is a hollow column, where an outer diameter is smaller than the diameter of the opening 14. The vibrating membrane 20 is further divided into two regions, namely two vibratile portions 21, due to the hollow column shape of the positioning member 31. The two vibratile portions 21 vibrate inside and outside the positioning member 31, respectively. Since each of the vibratile portions 21 provided with plural elastic members 40 at its peripheries thereof, the vibratile portions 21 can work in correspond with dynamic ranges of different sounds.

Figure 5:
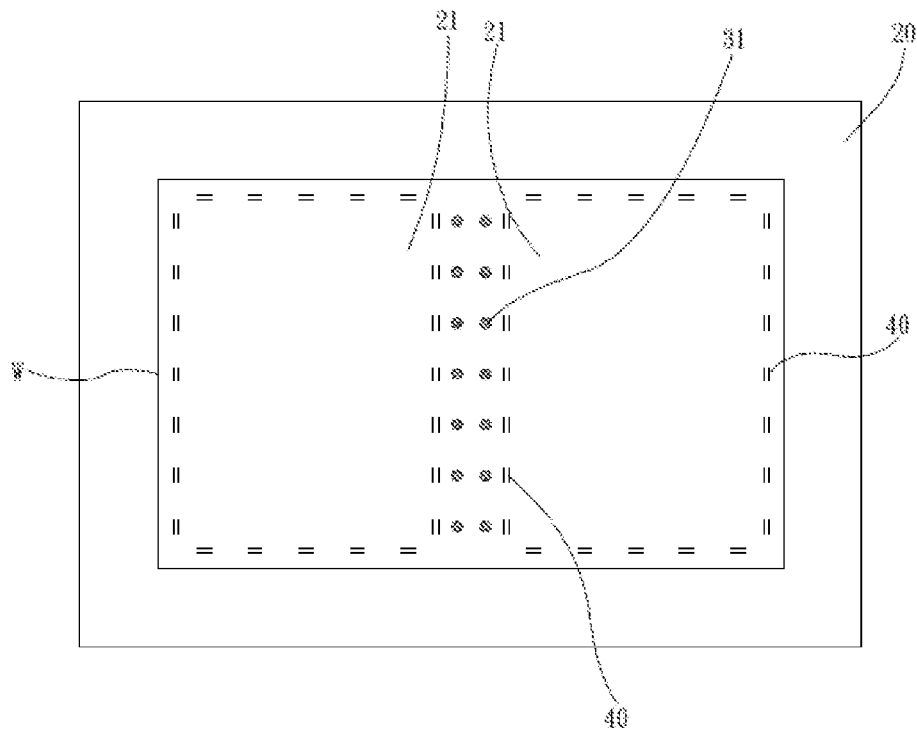
FIG. 5 is a vertical cross-sectional view of an acoustic transducer according to a third embodiment of the present invention.

In a third embodiment of the present invention, as shown in FIG. 5, an acoustic transducer is structurally similar to the first embodiment except that the opening 14 is square and the vibrating membrane 20 is rectangular. The positioning member 31 comprises a plurality of connecting posts arranged linearly along a direction, which is parallel to the width W of the vibrating membrane 20. In this case, the positioning member 31 also limits the vibration of the vibrating membrane 20 to some certain regions it defines. Herein, two vibratile portions 21 are defined and peripherally provided with plural elastic members 40, such that the deformable width of the vibratile portions 21 can be also adjusted to enhance the effective sensing area A.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. An acoustic transducer with high sensitivity, comprising:
   a base plate having an opening;
   a back plate;
   a vibrating membrane being peripherally fixed to the base plate and covering the opening;
   a positioning member connecting between the back plate and a central part of the vibrating membrane, and at least one vibratile portion defined;
   a plurality of elastic members are more elastic than the vibratile portion and arranging peripherally around the vibratile portion; and
   wherein the plurality of elastic members are arranged annularly along an inner periphery and an outer periphery of the vibratile portion, which the inner and outer peripheries are relatively adjacent to and far from the positioning member respectively.

2. The acoustic transducer of claim 1, wherein the positioning member is a solid column.

3. The acoustic transducer of claim 1, wherein the positioning member is a hollow column.

4. The acoustic transducer of claim 3, wherein the vibrating membrane is circular, and the positioning member is connected to a central part of the vibrating membrane, so as to make the at least one vibratile portion be in an amount of two.

5. The acoustic transducer of claim 1, wherein the positioning member is formed by a plurality of connecting posts.

6. The acoustic transducer of claim 5, wherein the vibrating membrane is circular, and the positioning member is connected to a central part of the vibrating membrane, so as to make the at least one vibratile portion be in an amount of two.

7. The acoustic transducer of claim 1, wherein the positioning member extends from the back plate toward the vibrating membrane so as to get connected with the vibrating membrane.

8. The acoustic transducer of claim 1, wherein the positioning member extends from the vibrating membrane toward the back plate so as to get connected with the back plate.

9. The acoustic transducer of claim 1, wherein the vibrating membrane is circular, and the positioning member is connected to a central part of the vibrating membrane, so as to make the vibratile portion be ring-shaped.

10. The acoustic transducer of claim 1, wherein the vibrating membrane is rectangular, and the positioning member is linearly arranged, so as to make the at least one vibratile portion be in an amount of two and all of them be rectangular.

11. The acoustic transducer of claim 1, wherein the elastic members perform deformation prior to the vibratile portion deforms.

12. An acoustic transducer with high sensitivity, comprising:
- a base plate having an opening;
- a back plate;
- a vibrating membrane being peripherally fixed to the base plate and covering the opening;
- a positioning member connecting between the back plate and the vibrating membrane, and at least one vibratile portion defined on the vibrating membrane thereby; and
- a plurality of elastic members arranging peripherally around the vibratile portion;
- wherein the plurality of elastic members are arranged annularly along an inner periphery and an outer periphery of the vibratile portion, which the inner and outer peripheries are relatively adjacent to and far from the positioning member respectively.

13. The acoustic transducer of claim 12, wherein the positioning member is connected to a central part of the vibrating membrane.

14. The acoustic transducer of claim 12, wherein the elastic members perform deformation prior to the vibratile portion deforms.

* * * * *